United States Patent
Rusu et al.

(10) Patent No.: US 7,053,724 B2
(45) Date of Patent: May 30, 2006

(54) DUAL SLOPE DUAL RANGE OSCILLATOR

(75) Inventors: Iulia Rusu, Redondo Beach, CA (US); Thomas Ribarich, Laguna Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 111 days.

(21) Appl. No.: 10/706,894

(22) Filed: Nov. 13, 2003

(65) Prior Publication Data

US 2004/0130400 A1    Jul. 8, 2004

Related U.S. Application Data

(60) Provisional application No. 60/426,225, filed on Nov. 14, 2002.

(51) Int. Cl.
*H03K 3/02* (2006.01)
*H03K 3/26* (2006.01)
*H03B 5/24* (2006.01)

(52) U.S. Cl. ............... 331/143; 331/111; 331/177 R
(58) Field of Classification Search ............ 331/111, 331/143, 175, 177 R, 179
See application file for complete search history.

(56) References Cited

U.S. PATENT DOCUMENTS

| 5,070,311 | A | * | 12/1991 | Nicolai ................. 331/111 |
| 5,142,217 | A | * | 8/1992 | Gontowski, Jr. ......... 323/272 |
| 5,546,054 | A | * | 8/1996 | Maccarrone et al. ..... 331/111 |
| 6,211,623 | B1 | | 4/2001 | Wilhelm et al. |
| 6,369,665 | B1 | * | 4/2002 | Chee et al. ............. 331/143 |
| 2002/0033739 | A1 | | 3/2002 | Bisanti et al. |
| 2002/0121940 | A1 | | 9/2002 | Chrissostomidis et al. |

* cited by examiner

*Primary Examiner*—David Mis
(74) *Attorney, Agent, or Firm*—Ostrolenk, Faber, Gerb & Soffen, LLP

(57) ABSTRACT

A dual range oscillator provides two different ranges of oscillator frequency output based on switched current sources charging a capacitor. As several current sources are combined to charge capacitor, the interval for charging the capacitor decreases and changes the oscillator frequency output accordingly. A reference voltage supplied to a comparator checks the voltage on the capacitor to determine when to combine current sources to charge the capacitor and modify the timing interval and the corresponding oscillator frequency output. The different current sources are switched to the capacitor to provide modified charging slopes. The dual slope, dual range oscillator permits frequency switching operation in a variety of environments and applications with a simplified control and integration into a single chip.

11 Claims, 8 Drawing Sheets

DUAL SLOPE DUAL RANGE OSCILLATOR

RELATED APPLICATION

The present application is based on and claims benefit of U.S. Provisional Application No. 60/426,225, filed Nov. 14, 2002, entitled a Dual Slope Dual Range On Chip Oscillator, to which a claim of priority is hereby made.

BACKGROUND OF THE INVENTION

1. Field of the Invention

The present invention relates generally to a controlled oscillator, and relates more particularly to a multiple range oscillator with selectable inputs for range selection.

2. Description of the Related Art

Oscillators, and especially on chip oscillators, are used in numerous applications involving integrated circuit products, for example. In particular, saw tooth oscillators are used in many applications and are traditionally implemented by providing a current source that charges a capacitor. The capacitor is charged and discharged to produce an oscillating output. Voltage controlled oscillators also provide an oscillator output based on a control voltage to determine the frequency of the output saw tooth waveform.

It has often been the case that a high precision current source is used to charge the capacitor to establish a precision frequency. The precision current source is typically controlled with a precision resistor. Because of the precision required, the high precision resistor is typically provided as an external resistor to an integrated circuit that includes the current source. It would be desirable to obtain a completely integrated current source to obtain a precision oscillator output.

A VCO likewise uses a high precision resistor to obtain a precision current source to charge an appropriate capacitor. However, forming a high precision resistor on an integrated circuit is difficult and may not be workable in desired applications. That is, the use of an on chip resistor with an on chip current source typically provides very poor precision (approximately 35%) because of the variations in resistor processing in an integrated circuit. That is, the manufacturing processes used to create an on chip resistor are difficult to control to pro☐uce precise and consistent results. The result is often poor precision due to process variations in the manufacturing process that can lead to inconsistencies among various integrated devices. In addition, temperature variations impact the on chip resistor and on chip current source to cause operational variations that would have to be compensated for with additional circuitry. Accordingly, it would be desirable to obtain a high precision oscillator in an integrated circuit without additional external components or circuitry for compensation.

SUMMARY OF THE INVENTION

In accordance with the present invention, a dual frequency range VCO is provided to produce a range of frequencies with a saw tooth oscillator waveform output based on an input voltage. While a number of scenarios are contemplated as within the scope of the present invention, a simple control scheme for switching between the two frequency ranges is based on a switch being on or off. By integrating the switch into the oscillator and providing it on the IC, applicable settings for both frequency ranges can be arranged on the IC. For example, a minimum operating frequency specific to the frequency range can be provided, as well as a specific frequency precision range to maintain an appropriate tolerance for the selected frequency range. The frequency range settings are preferably consistent over changes in temperature and process variations during manufacturing of the IC.

In one range, for example, the oscillator frequency varies from 50 kHz±10 kHz to a minimum frequency of approximately 25 kHz±5 kHz. The frequency change is, for example, inversely proportional to an input control voltage ranging from zero to 5 volts. That is, zero volts on the input control voltage corresponds to 50 kHz, while 5 volts on the input control voltage corresponds to approximately 25 kHz.

Another range is provided in which the oscillator frequency can vary from 250 kHz±50 kHz to the minimum frequency of approximately 25 kHz±5 kHz. Again this frequency range is controlled with an input voltage varying from zero to 5 volts, for the maximum and minimum frequencies, respectively.

BRIEF DESCRIPTION OF THE DRAWINGS

The present invention is described in greater detail below, with reference to the accompanying drawings, in which.

DETAILED DESCRIPTION OF THE PREFERRED EMBODIMENTS

The present invention provides a dual slope dual range on chip oscillator that can be operated in a number of ranges to provide flexibility for various oscillator applications. The present invention is particularly useful in several applications, including lighting, power supplies, resonance circuits generally, or where PWM switching is used. By providing a dual slope, dual range oscillator, ranges of operations for oscillator applications can be modified in real time to provide a wider range of operation for the integrated circuit oscillator, as well as greater flexibility for oscillator applications.

Figure 1:
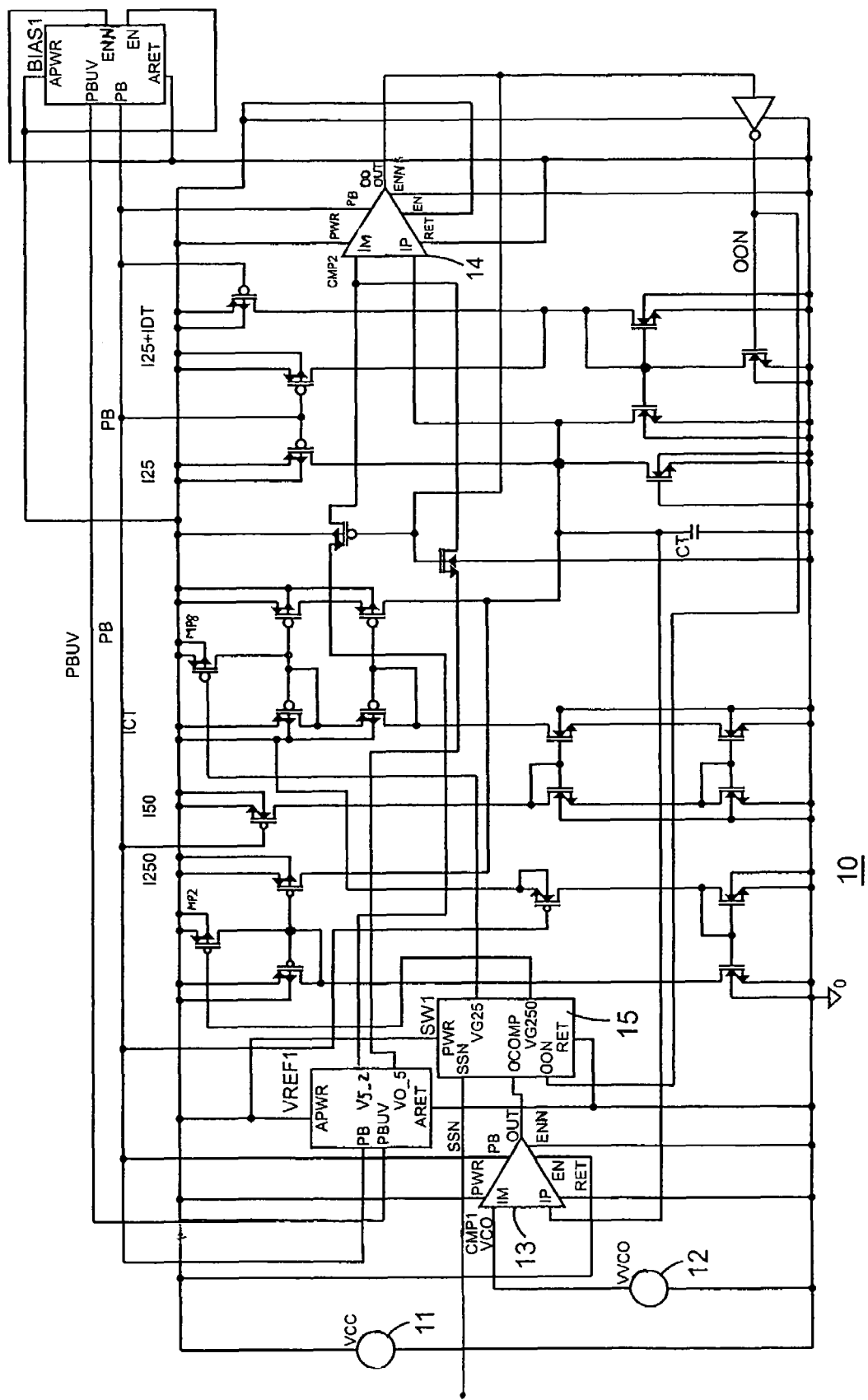
FIG. 1 is a circuit schematic of an exemplary embodiment according to the present invention.
Figure 1A:
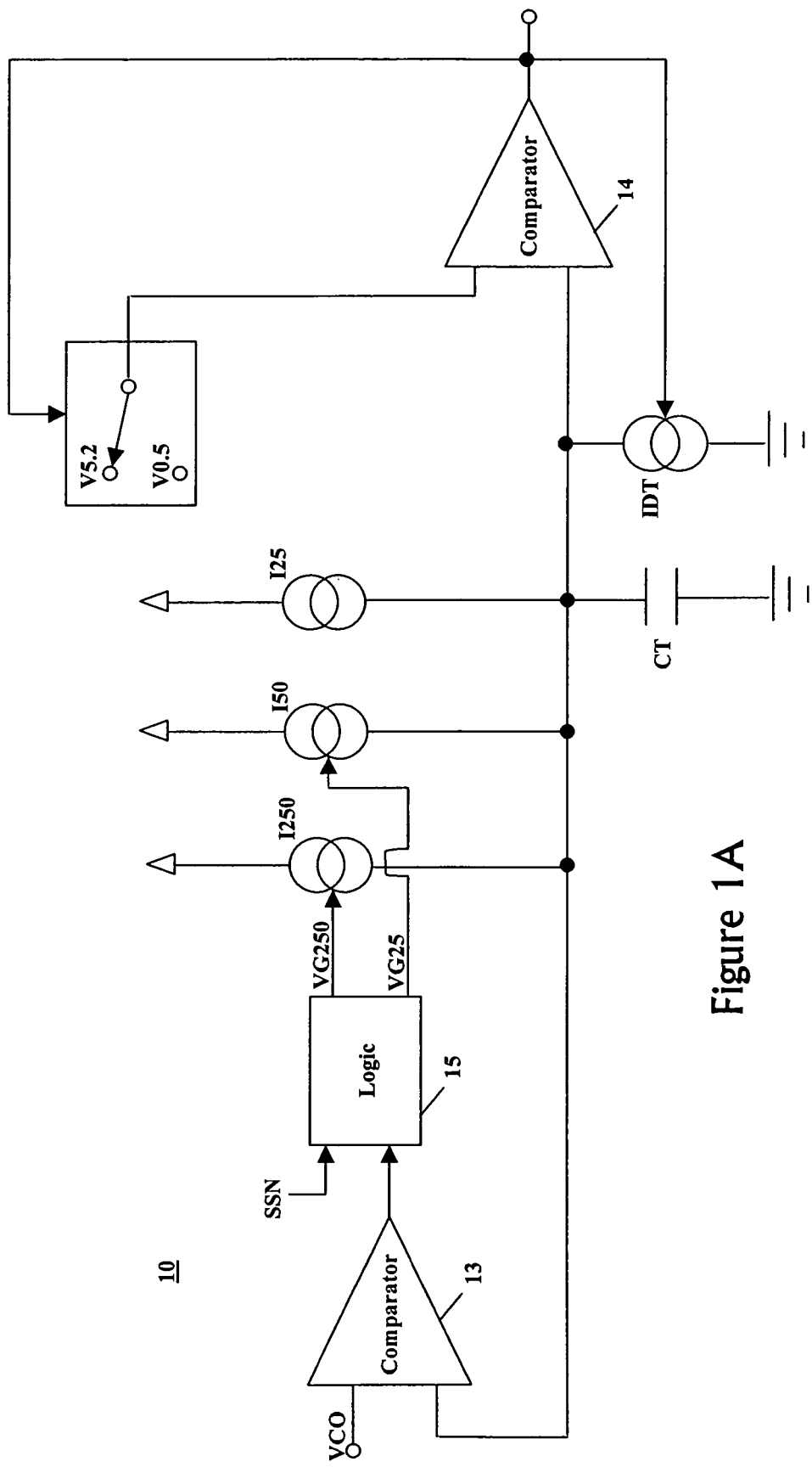
FIG. 1A is a simplified circuit schematic of the circuit schematic shown in FIG. 1.

Referring now to FIG. 1, a schematic diagram of an embodiment according to the present invention is shown generally as circuit 10. FIG. 1A shows a simplified schematic diagram of circuit 10. Circuit 10 includes several representative inputs including a power VCC input 11 and a control voltage VVCO input 12. A comparator 13 receives voltage VVCO input 12 and determines when additional current is to be supplied to a capacitor CT by operation of a switch 15. Switch 15 controls the switching between the two different frequency ranges available in the oscillator output by operation of various circuitry elements to control charging and discharging of capacitor CT. A comparator 14 is provided to control the shift between charging and discharging mode of capacitor CT. The threshold of comparator 14 is shifted between 0.5 volts and 5.2 volts, for example, to obtain an oscillator output with a rapid response.

The oscillator output is a saw tooth waveform in this exemplary embodiment with a minimum frequency of approximately 25 kHz±5 kHz. The minimum frequency range is highly independent of changes in temperature and manufacturing process variations. In a first range, the oscillator frequency has a range of from about 50 kHz±10 kHz to the minimum frequency, as the input voltage to comparator 13 changes from 0 to 5 volts. That is, when voltage VVCO input 12 is 0 volts, a maximum frequency in the selected range is produced. When voltage VVCO input 12 is 5 volts, the oscillator frequency output is the minimum value, or minimum frequency in the selected range.

A second frequency range is provided with a maximum frequency of approximately 250 kHz±50 kHz. The minimum frequency in this second range is again 25 kHz±5 kHz as in the first range for convenience and practical application. However, it should be apparent that minimum frequencies can be varied over the different ranges. As with the first range, the maximum frequency in the second range is established at 0 volts on voltage VVCO input 12, while a minimum output frequency corresponds to 5 volts on voltage VVCO input 12. Again, it should be apparent that any correlation between input voltage and minimum amd maximum frequency values for a given frequency range can be used. In addition, it should also be apparent that any number of frequency ranges may be provided.

In circuit 10, several current sources are available for charging capacitor CT. A current source I25 is derived from a current reference cell, and is always turned on to charge capacitor CT. In the exemplary embodiment, the current reference cell uses a delta VBE/R configuration to obtain a current source. Current source I25 is also used as the default current source to obtain the minimum oscillator frequency output, i.e., when no other current sources are used to charge capacitor CT. Accordingly, current source I25 is always available and always supplying current to capacitor CT in this exemplary embodiment.

Different ranges of oscillator frequency output are obtained by adding various currents to current source I25 to charge capacitor CT at a faster rate. As capacitor CT charges more quickly, the output oscillator frequency tends to increase. In one particular range, as illustrated in circuit 10, a current source I50 is coupled with current source I25 to provide additional current to capacitor CT. The point at which current source I50 is connected to the oscillator circuit is determined by comparator 13 and voltage VVCO input 12, in conjunction with a status of switch 15. Comparator 13 compares voltage VVCO input 12 with the voltage on capacitor CT to produce an output to switch 15. Switch 15 uses the output from comparator 13 to switch an additional current source in combination with current source I25 to increase the speed at which capacitor CT charges. Which current source is combined with current source I25 is determined by other inputs to switch 15, including values at the SSN input lead. The inputs to switch 15 could, for example, signal a specific current source to combine with current source I25 based on a circuit power up status.

When switch 15 switches in a current source with current source I25, a frequency range determination occurs. For example, when I50 is combined with I25, a first frequency range is applied, with limits of the range supplied by the range of input on voltage VVCO input 12. In operation, when voltage VVCO input 12 is approximately equal to the voltage on capacitor CT, the output of comparator 13 turns on. The output VG25 on switch 15 correspondingly operates to turn off switch MP8 to permit current source I50 to flow into capacitor CT with current source I25. Accordingly, the increased current supplied to capacitor CT provides a second charging slope that is steeper than that when the output of comparator 13 is low. That is, the charging slope for capacitor CT is shallow during charging with current source I25, and steeper during the charge supplied by current source combinations I25 and I50 when switch MP8 is turned off.

Similarly, to obtain a second frequency range, switch 15 is configured through the SSN input lead to select current source I250 to combine with current source I25. In particular, when switch 15 is configured in this way, as voltage VVCO input 12 is approximately equal to the voltage on capacitor CT, the output of comparator 13 turns on, causing output VG250 of switch 15 to turn switch MP2 off. As a result, current source I250 flows into capacitor CT with current source I25, thereby further increasing the steepness of the slope for charging capacitor CT. By selecting between different current sources and switching the various current sources into capacitor CT at different charging times, different frequency ranges and different frequency values can be adapted and controlled for various oscillator applications. According to this exemplary control scheme, the charging current is set at a fixed first slope for any frequency range selected when the output of comparator 13 is off, and set at a steeper slope relative to the selected frequency range when comparator 13 turns on.

Figure 2:
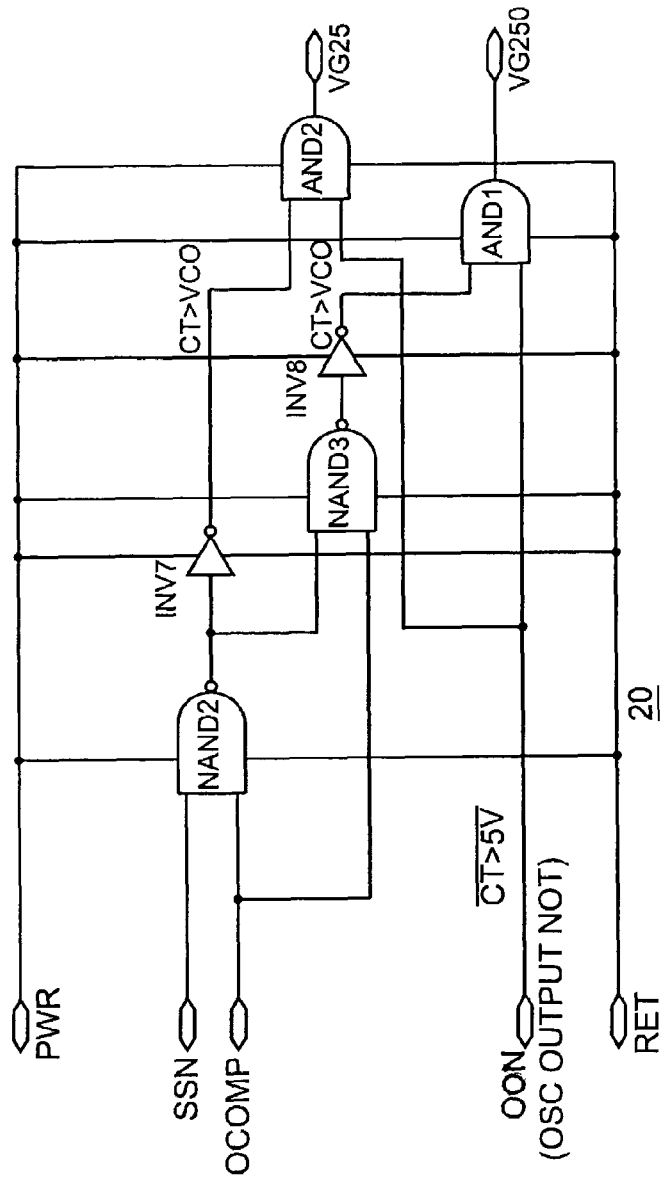
FIG. 2 is a logic diagram of an exemplary embodiment of a control scheme in accordance with the present invention.

Referring now to FIG. 2, a logic diagram of current charging control is illustrated generally as diagram 20. Diagram 20 represents the logical components of switch 15 illustrated in circuit 10 of FIGS. 1 and 1A. Diagram 20 shows how the digital signals VG25 and VG250 are supplied to switches MP8 and MP2 to switch between different ranges of oscillator frequency output. In addition, the outputs provided by the logic circuit in diagram 20 control the slope of the charge on capacitor CT once the output of comparator 13 turns on, i.e., input OCOMP in diagram 20 goes high. The setpoint provided by reference voltage VVCO input 12 determines the switching point for the slope change as capacitor CT charges, and the selected frequency range determines how steep the slope will be. This relationship between setpoint and selected frequency range is illustrated and described in greater detail below.

Discharging of capacitor CT is also controllable by modifying a current source IDT. Referring again to FIGS. 1 and 1A, current source combination IDT and I25 constitute the current through which capacitor CT is discharged each period of the saw tooth oscillator frequency output. The discharge slope for the charge on capacitor CT is relatively steep with respect to the charging slopes, through the influence of the combination of IDT and I25. The discharge time for capacitor CT is chosen based on the application and should be sufficient for obtaining the maximum desired frequency in the selected range, as described in greater detail below.

The voltage range on capacitor CT in this exemplary embodiment is set to be 0.5 to 5.2 volts. It should be apparent that any type of voltage range can be chosen for the purposes of providing an appropriate oscillator frequency output for a given application. The upper and lower voltage ranges for the voltage on capacitor CT are provided by on chip voltage references that use, for example, a zener diode and a resistor divider. Any type of on chip voltage reference with reasonable accuracy is acceptable for use with the present invention. That is, expensive or complex voltage references for the range of voltage on capacitor CT need not be realized in order to achieve the present invention.

Referring for a moment to FIGS. 1 and 1A, comparator 14 controls the shifting between charging and discharging modes of capacitor CT by varying the applied thresholds of the comparator inputs between 0.5 volts and 5.2 volts. For example, if a threshold voltage on comparator 14 is set to 5.2 volts, as the voltage on capacitor CT charges through 5.2 volts, the threshold on comparator 14 switches to 0.5 volts. This simple threshold switching scheme permits the output of comparator 14 to switch until the voltage on capacitor CT drops below 0.5 volts. Once capacitor CT has discharged through 0.5 volts, the threshold on comparator 14 is again switched to 5.2 volts to await the next charging cycle of capacitor CT. By using this arrangement, a simple and responsive oscillator switching scheme is achieved at the output of comparator 14 to provide a simple control, in several ranges, for oscillator frequency output.

Figure 3:
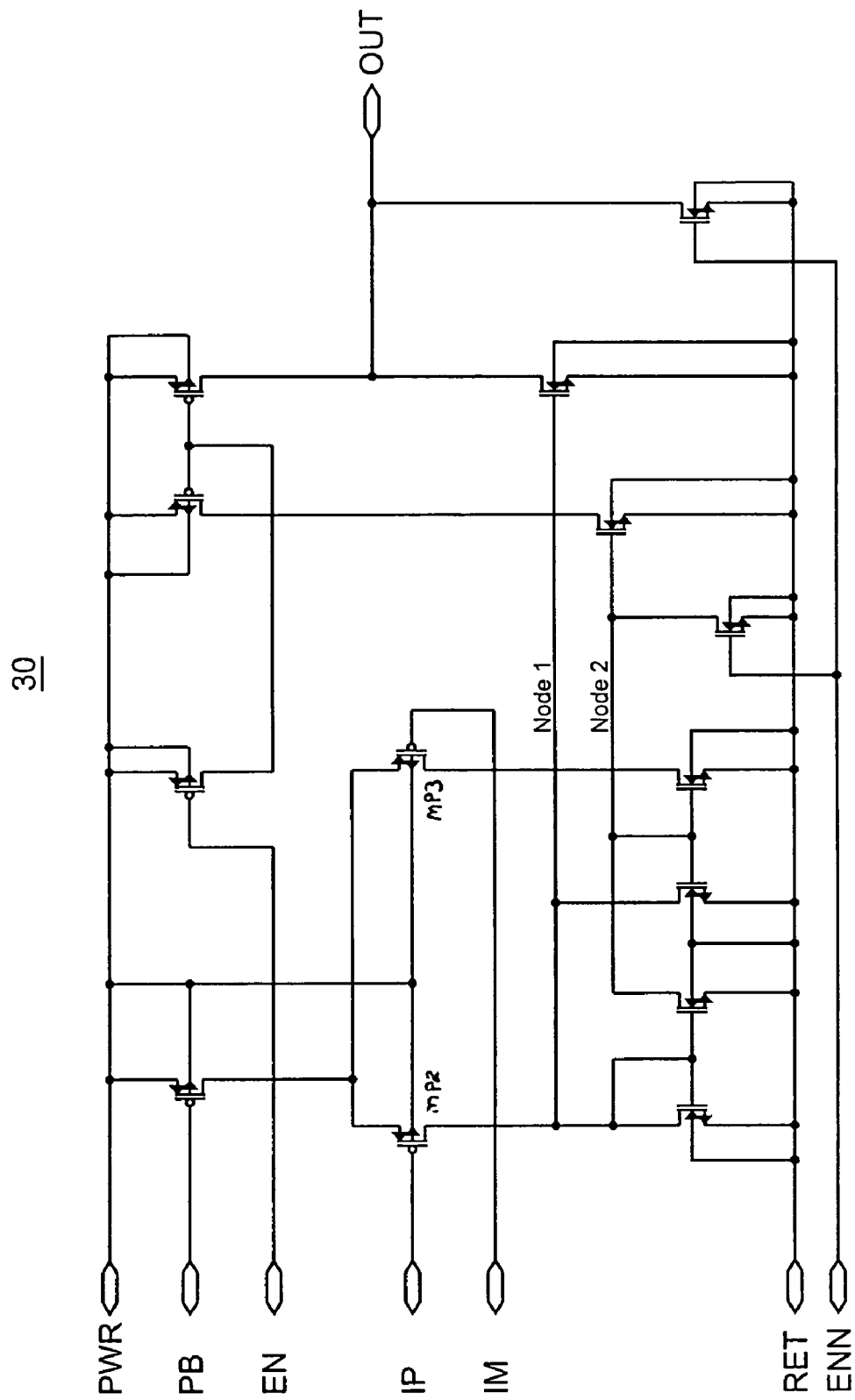
FIG. 3 is a circuit diagram showing comparator operation according to an embodiment of the present invention.

Referring now to FIG. 3, a circuit diagram of comparators 13 and 14 is provided generally as diagram 30. Switches MP2 and MP3 provide the comparison function for the circuit in diagram 30 to switch the output on or off. Because comparators 13, 14 may perform the same internal function while accomplishing very different tasks, the same representative control module may be used for both devices, reducing complexity of the system.

Figure 4:
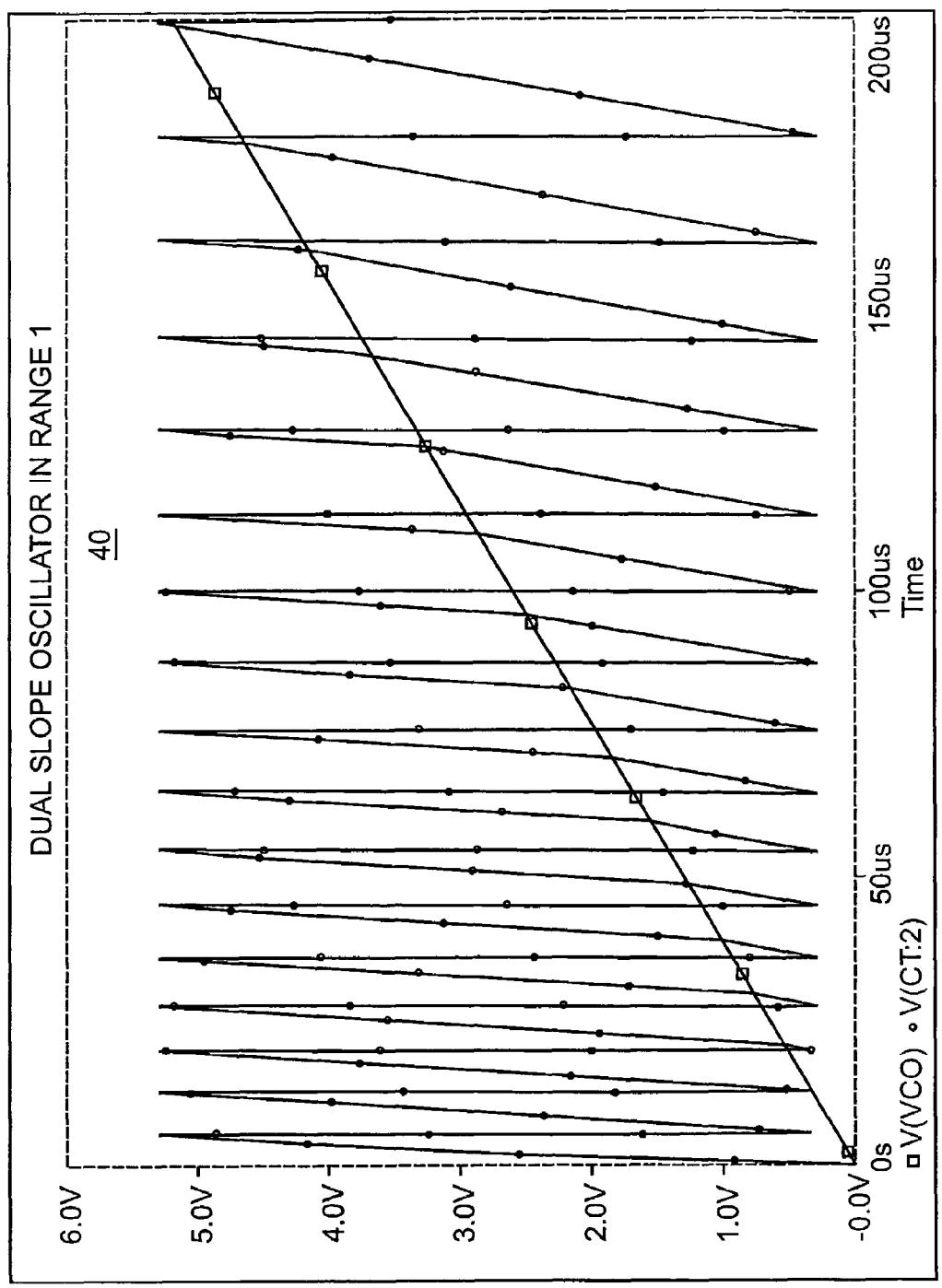
FIG. 4 is a graph showing an exemplary oscillator operation in one frequency range in accordance with the present invention.

Referring now to FIG. 4, a graph 40 of voltage versus time is shown for a first range of oscillator frequency output. Graph 40 illustrates operation of oscillator output over the range of frequencies for the first range, as voltage VVCO input 12 changes from 0 to 5 volts. That is, graph 40 shows higher frequencies when voltage VVCO input 12 is at a lower value than when it is at a value closer to the top of its range. It can be observed in graph 40 that the peaks of the saw tooth waveform fall closer together when voltage VVCO input 12 is a lower value, i.e., the oscillator output is higher in frequency. Similarly, the peaks of the saw tooth waveform fall farther apart as voltage VVCO input 12 approaches its maximum value.

Graph 40 illustrates the change in slope of the saw tooth waveform as different current combinations are applied to charge capacitor CT. By following the slope of voltage VVCO input 12 plotted on graph 40, the change in slope for the oscillator saw tooth waveform can be observed for different setpoints. When the change in slope is near the bottom of the waveform, i.e., voltage VVCO input 12 is at a low value, the shallower slope provided by current source I25 has less time to influence the charging time of capacitor CT. Accordingly, the higher current combination of current source I25 plus I50 provides a higher frequency oscillator output, due to realization of a steeper charging slope in capacitor CT. As voltage VVCO input 12 reaches higher values, the slope of the lower current charge to capacitor CT has a greater influence on the charging time, and thus the frequency output of the oscillator. That is, near the top of the range for voltage VVCO input 12, nearly the entire saw tooth waveform is derived from the slope of current source I25, thereby approaching a minimum frequency value. Accordingly, the charging time for capacitor CT is related to voltage VVCO input 12, i.e., dependent upon the amount of time that current source I25 is permitted to charge capacitor CT, and the selected frequency range of operation.

Figure 5:
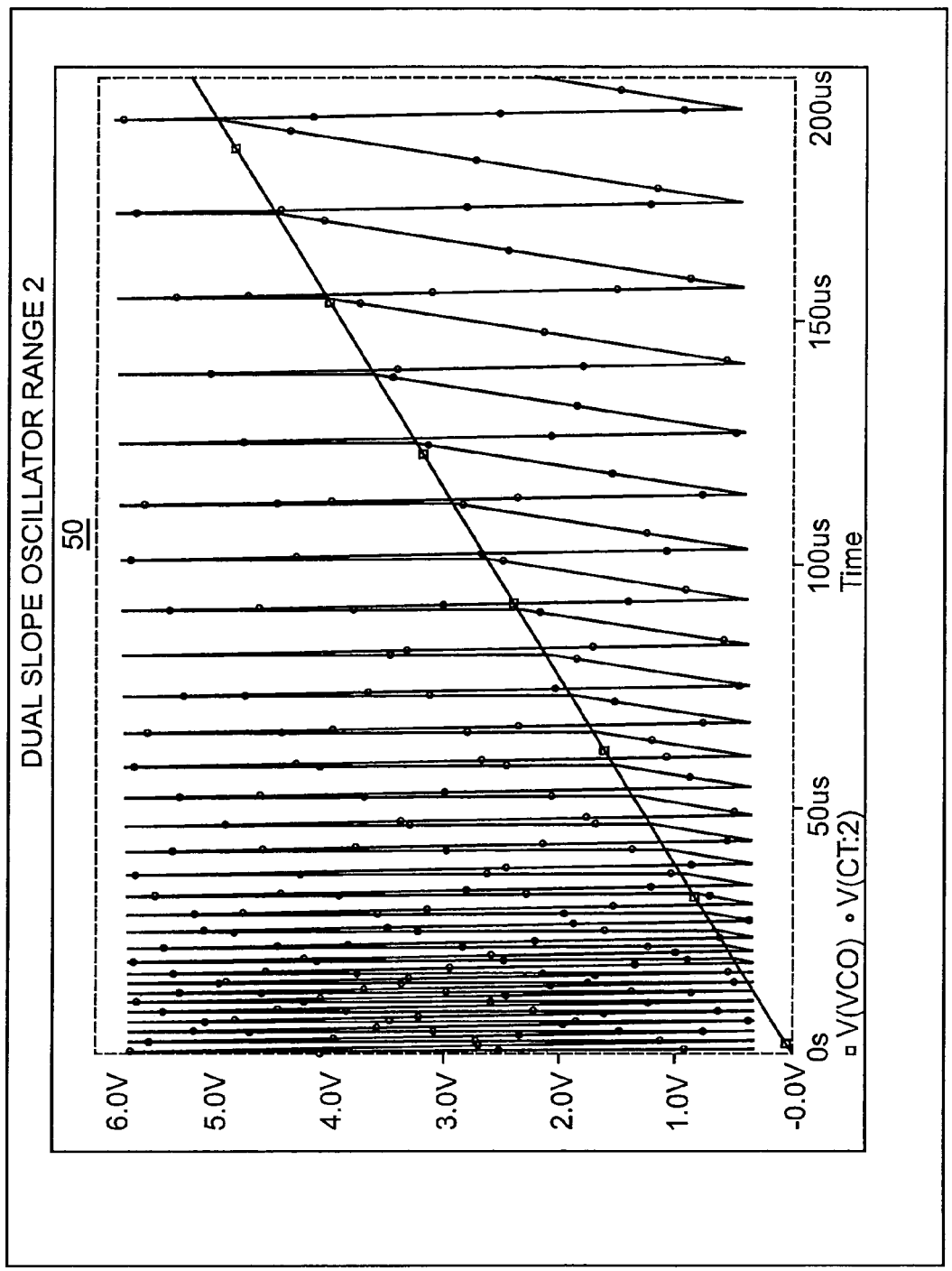
FIG. 5 is a graph showing an exemplary oscillator operation in a second frequency range in accordance with the present invention.

Referring now to FIG. 5, a graph 50 shows an overlaid relationship between voltage VVCO input 12 and the oscillator frequency output in a second range. It can be observed from graph 50 as voltage VVCO input 12 approaches zero, the oscillator output is at a very high frequency, i.e., nearly the same charge time as discharge time for capacitor CT. As voltage VVCO increases towards its maximum value, the frequency output of the oscillator is correspondingly reduced down to a minimum frequency. As with the first selected range of operation, a dual slope range of operation is shown in graph 50, where the impact of the amount of time that capacitor CT is charged with a lower current source on the frequency output is easily observed. That is, the combination of different slopes for current supplied to capacitor CT and the corresponding charging times produces the desired frequency output in the selected range.

Figure 6:
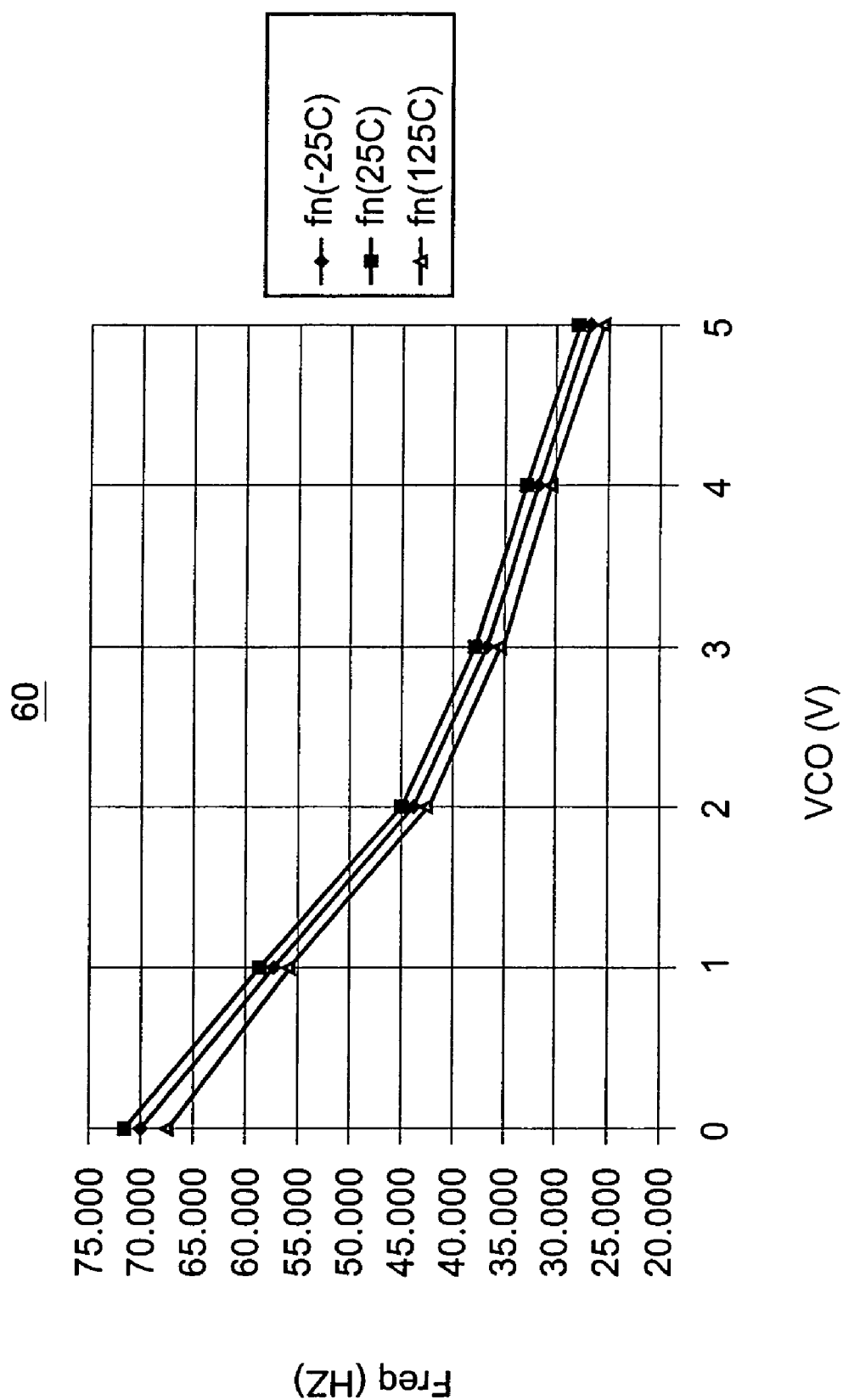
FIG. 6 is a graph illustrating frequency versus input voltage for a first frequency range in accordance with an embodiment of the present invention.

Referring now to FIG. 6, a graph 60 shows a plot of a first range of frequency versus voltage VVCO input 12. The lines on graph 60 show frequency versus voltage operation for various temperatures ranges from minus 25 to 125° C. As can easily be seen by the plot in graph 60, there is very little variation of oscillator frequency at a given voltage set point over a large range of temperature values. Accordingly, a reliable accuracy in precision is obtained for oscillator frequency output in a variety of modes.

Figure 7:
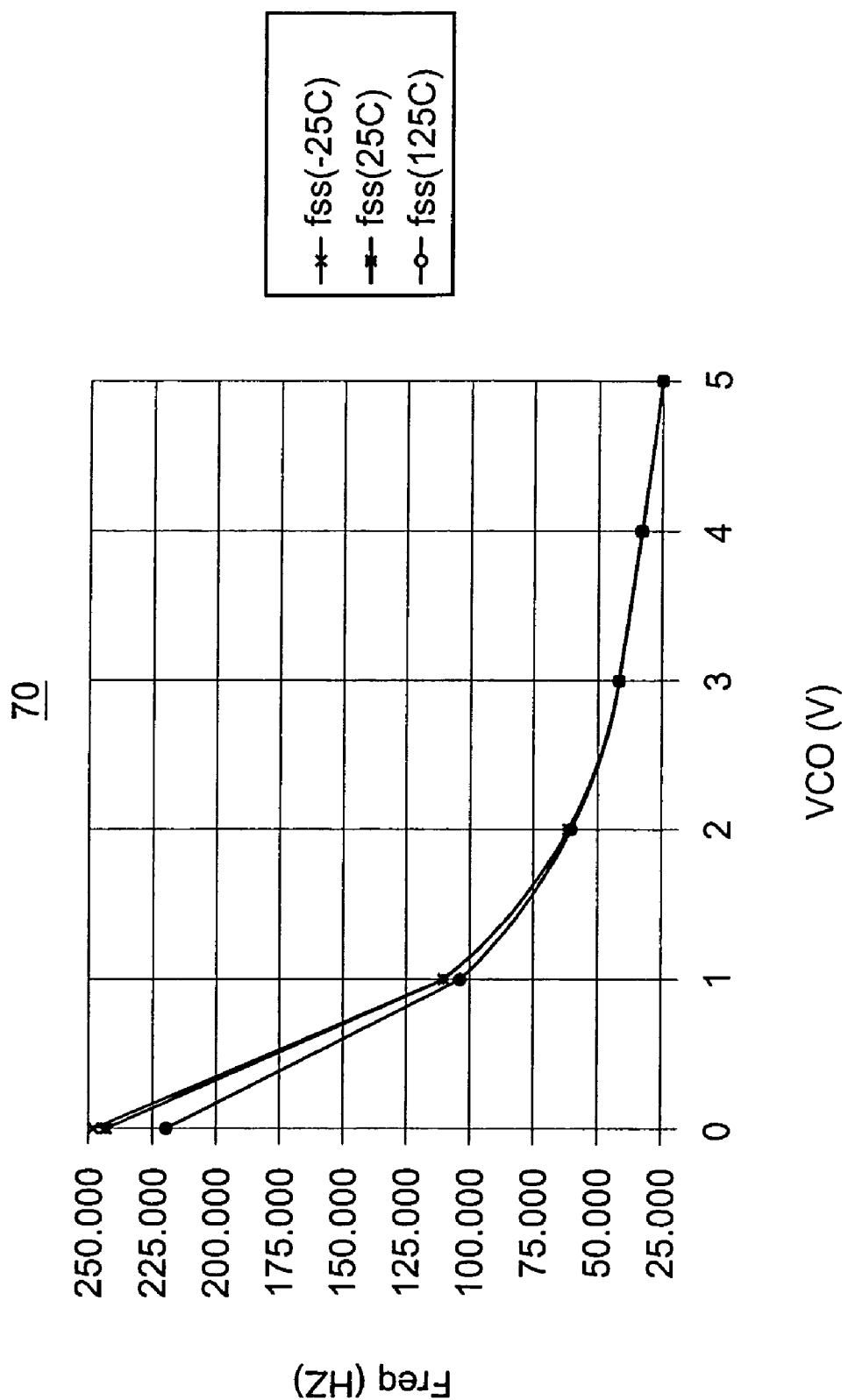
FIG. 7 is a graph illustrating frequency versus input voltage for a second frequency range in accordance with an embodiment of the present invention.

Referring now to FIG. 7, a graph 70 shows several plots of frequency versus voltage VVCO input 12. The frequency ranges from 250 kHz to 25 kHz while voltage VVCO input 12 ranges from 0 to 5 volts, respectively. Again, as with graph 60, there is very little variation of output oscillator frequency at a given setpoint over the range of temperatures from minus 20 to 125° C.

The present invention provides a reliable dual range oscillator output based on charging times of a capacitor with a charging profile that includes two different slopes resulting from applied current. The invention obtains a variety of oscillator outputs and ranges with little variation over temperature or manufacturing processes. A particularly useful application for the present invention is in the field of fluorescent lighting. For example, it is desirable to operate an electronic ballast in a dual range of oscillator frequency values. For example, it may be desirable to have a frequency range that is very broad for starting a lamp with an electronic ballast, and then decreasing the frequency operation range for normal running mode in the lamp and ballast combination. By providing a dual range of oscillator frequency output, operational efficiency and extended component life can be realized.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An integrated circuit with an oscillator, comprising:
   a switch control having a reference input and an output, the output being derived from a relationship of the reference input and a value of a timing element supplied to the switch control;
   a plurality of current sources switchably connected to the timing element and for providing a second timing rate for the timing element, the second timing rate and a first timing rate determining an oscillation period of the oscillator;
   a switching circuit connected to the output of the switch control and being operable to select which of the plurality of current sources is connected to the timing element to provide the second timing rate; and wherein the output of the switch control causes the switching circuit to connect the selected current source to the timing element during each oscillation period.

2. The circuit according to claim 1, wherein the switch control is a comparator having a voltage reference input.

3. The circuit according to claim 1, further comprising a reference voltage input to the switch control, the reference voltage influencing a point at which the selected current source is connected to the timing element.

4. A method for operating an oscillator, comprising:
charging a capacitor at a first rate to obtain a first time interval;
charging the capacitor at a second rate to obtain a second time interval;
combining the first time interval and the second time interval and thereafter discharging the capacitor to obtain an oscillation frequency; and
varying at least one of the first and second time intervals to change a corresponding oscillation frequency.

5. The method of claim 4, further comprising comparing a reference value to a charging value to influence the timing intervals.

6. The method according to claim 4, further comprising switching a circuit parameter to modify at least one of the first and second timing interval.

7. A circuit for providing a plurality of oscillator output values, comprising:
a timing component for providing a variable timing interval;
a plurality of timing sources switchably connected to the timing component to provide a second timing interval for the timing component, the second timing interval and a first timing interval determining an oscillation period of the output value;
a switch for selecting which of the plurality of timing sources to connect to the timing element to provide the second timing interval; and
a switch control for controlling when during each oscillation period the switch connects the selected timing sources to the timing element to provide the second timing interval.

8. The circuit according to claim 7, wherein the switch control is a comparator with a reference value input.

9. The circuit according to claim 7, wherein the timing component is a capacitor and the timing sources are current sources that impact a charging time of the capacitor.

10. The circuit according to claim 9, further comprising a discharging current source for discharging the capacitor.

11. A circuit with an oscillator output, comprising:
a plurality of current sources for providing a second slope, the second slope and a first slope forming portions of a waveform determining a period of the oscillator output;
a switch for switching among the plurality of current sources to produce the second slope;
a timing device output determined by the first slope; and
a reference value for comparison with the timing device output to produce a control output, the control output being operable to influence the switch to select the second slope.

* * * * *